United States Patent
Brandl

(10) Patent No.: US 9,293,188 B2
(45) Date of Patent: Mar. 22, 2016

(54) MEMORY AND MEMORY CONTROLLER FOR HIGH RELIABILITY OPERATION AND METHOD

(71) Applicant: Advanced Micro Devices, Inc., Sunnyvale, CA (US)

(72) Inventor: Kevin M. Brandl, Austin, TX (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 0 days.

(21) Appl. No.: 14/171,362

(22) Filed: Feb. 3, 2014

(65) Prior Publication Data

US 2015/0221358 A1    Aug. 6, 2015

(51) Int. Cl.
| | |
|---|---|
| *G11C 7/22* | (2006.01) |
| *G11C 11/408* | (2006.01) |
| *G11C 11/406* | (2006.01) |
| *G06F 13/16* | (2006.01) |
| *G11C 7/10* | (2006.01) |

(52) U.S. Cl.
CPC ........ *G11C 11/4087* (2013.01); *G06F 13/1642* (2013.01); *G06F 13/1668* (2013.01); *G11C 7/1072* (2013.01); *G11C 11/406* (2013.01); *G11C 11/4085* (2013.01); *G11C 11/40611* (2013.01); *G11C 11/40622* (2013.01); *G11C 7/22* (2013.01); *G11C 7/222* (2013.01)

(58) Field of Classification Search
CPC ......... G11C 7/22; G11C 7/1072; G11C 7/222
USPC .............................. 365/233.1, 185.09, 185.18
See application file for complete search history.

(56) References Cited

U.S. PATENT DOCUMENTS

| | | | |
|---|---|---|---|
| 2008/0239809 A1* | 10/2008 | Chae et al. | ................ 365/185.09 |
| 2014/0006703 A1 | 1/2014 | Bains et al. | |
| 2014/0059287 A1 | 2/2014 | Bains et al. | |
| 2014/0095780 A1 | 4/2014 | Bains et al. | |

OTHER PUBLICATIONS

JEDEC Solid State Technology Association, "JEDEC Standard, DDR4 SDRAM," JESD79-4, Sep. 2012, 214 pages, JEDEC Solid State Technology Association, 3103 North 10th Street, Suite 240 South, Arlington, VA 22201-2107.

* cited by examiner

*Primary Examiner* — Jason Lappas
(74) *Attorney, Agent, or Firm* — Polansky & Associates, P.L.L.C.; Paul J. Polansky

(57) ABSTRACT

In one form, a memory includes a memory bank, a page buffer, and an access circuit. The memory bank has a plurality of rows and a plurality of columns with volatile memory cells at intersections of the plurality of row and the plurality of columns. The page buffer is coupled to the plurality of columns and stores contents of a selected one of the plurality of rows. The access circuit is responsive to an adjacent command and a row address to perform a predetermined operation on the row address, and to refresh first and second addresses adjacent to the row address. In another form, a memory controller is adapted to interface with such a memory to select either a normal command or an adjacent command based on a number of activate commands sent to the row in a predetermined time window.

27 Claims, 8 Drawing Sheets

MEMORY AND MEMORY CONTROLLER FOR HIGH RELIABILITY OPERATION AND METHOD

FIELD

This disclosure relates generally to data processing systems, and more specifically to semiconductor memories and memory controllers for semiconductor memories.

BACKGROUND

Computer systems use main memory that is typically formed with inexpensive and high density dynamic random access memory (DRAM) chips. When a particular row in a DRAM chip is activated for reading or writing, the word line associated with the row is activated, and the contents of the memory cells along the row are read into a page buffer. Subsequent read and write accesses to memory cells in the row can take place wholly within the page buffer, without accessing the row again. When a data processor later accesses another row in the same memory bank, the memory cells along the row are restored in a precharge operation before the other row can be activated.

Modern DRAM chips typically store one to eight gigabits (Gb) of data using deep sub-micron technology. Because of the high density and small feature size, rows of the memory are so physically close to other rows that the activation of a particular row can upset data stored in adjacent rows by changing the charge on the memory cell capacitors. Typically these upsets are harmless because the memory cells are refreshed periodically. However occasionally some memory access patterns cause certain rows to be activated and precharged so many times before the next refresh cycle that the memory cells in adjacent rows become corrupted and reverse logic state. After being corrupted, the original data is lost and cannot be restored in subsequent refresh cycles.

One known technique to address the data upset problem is known as targeted row refresh (TRR). In order to ensure that a DRAM row is not activated too many times within a refresh period, a memory controller places the DRAM into a TRR mode by setting certain mode register bits. The controller then issues successive activate and precharge commands to the target row as well as the two physically adjacent rows. Once TRR mode is enabled, no other mode register commands are allowed until the TRR mode is completed. TRR mode is self-clearing and the mode register bit is set after the completion of TRR mode. While TRR allows the memory controller to avoid excessive activates to a certain row within a certain time period, it is entered by setting the mode register, which requires a substantial amount of time since all banks must be in the idle state before the controller can issue a Mode Register Set command.

Figure 1:
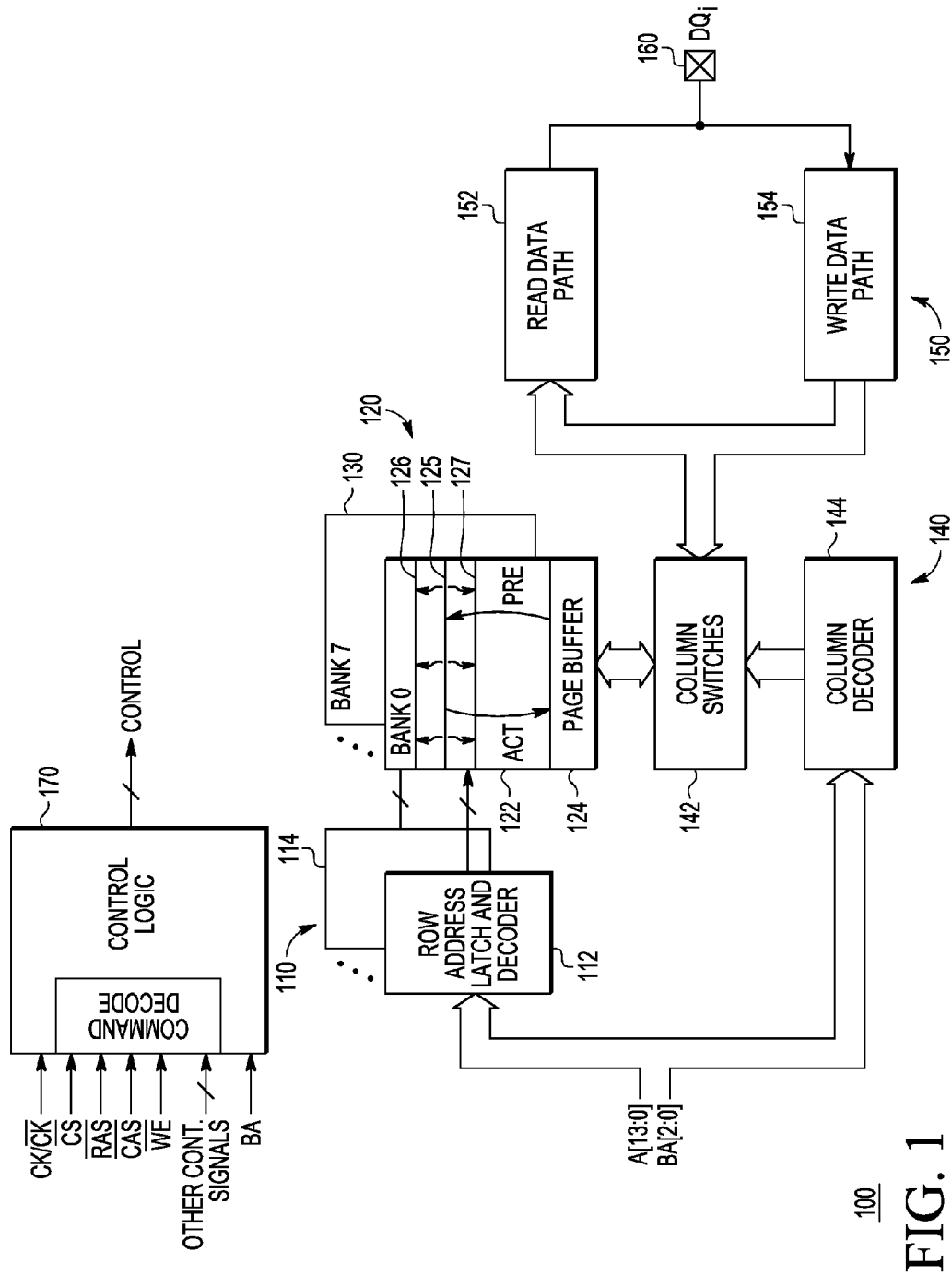
FIG. 1 illustrates in block diagram form a memory susceptible to data upset according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

In one form, a memory addresses the data corruption problem by supporting a new adjacent command. The memory includes a memory bank, a page buffer, and an access circuit. The memory bank has a plurality of rows and a plurality of columns with volatile memory cells at intersections of the plurality of row and the plurality of columns. The page buffer is coupled to the plurality of columns and stores contents of a selected one of the plurality of rows. The access circuit is responsive to the adjacent command and a row address to perform a predetermined operation on the row address, and to refresh first and second addresses adjacent to the row address.

In another form, a memory controller is capable of issuing an adjacent command to a memory to alleviate the data upset problem. The memory controller includes a queue and an arbiter. The queue has a plurality of entries for storing memory accesses received from a memory accessing agent, such as a cache used by at least one central processing unit (CPU) core or a graphics processing unit (GPU). The arbiter is coupled to the queue and provides a plurality of control signals to select a memory access from the queue for dispatch to the memory. If the memory access requires a predetermined operation on a row in the memory, the arbiter further selects either a normal command or an adjacent command corresponding to the predetermined operation based on a number of activate commands sent to the row in a predetermined time window.

In yet another form, a system is adapted to provide activate adjacent commands from a data processor to a memory system. The data processor has an output for coupling to the memory system, and provides selected ones of a normal command and an adjacent command based on a number of activate commands sent to a row in the memory system during a predetermined time window. The memory system is responsive to the adjacent command and a row address to perform a predetermined operation on the row address, and to refresh first and second addresses adjacent to the row address.

FIG. 1 illustrates in block diagram form a memory 100 susceptible to data upset. Memory 100 is a dynamic random access memory (DRAM) and generally includes a row path 110, eight memory banks 120, a column circuit 140, a data path 150, a representative one of a set of data pads 160 labeled "DQ$_i$", and a control logic circuit 170.

Row path 110 includes a row address latch and decoder for each bank such as a row address latch and decoder 112 for a first bank labeled "BANK 0" and a row address latch and decoder 114 for a last bank labeled "BANK 7". Row path 110 has a set of inputs for receiving a a row address labeled "A[13:0]" and a bank address labeled "BA[2:0]", and a set of outputs. Each of the eight memory banks 120 includes an associated memory array and a page buffer such as memory array 122 and page buffer 124 for BANK 0. Each of the eight memory banks 120 has a set of inputs connected to the set of outputs of a corresponding row address latch and decoder.

Column circuit 140 includes a set of column switches 142 and a column decoder 144. The set of column switches 142 is connected to the page buffer of each of memory banks 120, and has a set of inputs for receiving column selection signals. Column decoder 144 has a set of inputs for receiving a column address conducted on inputs A[13:0] for selecting a column of one of the eight banks selected by BA[2:0], and a set of outputs connected to the inputs of column switches 142.

Data path 150 includes a read data path 152 and a write data path 154. Read data path 152 has a set of inputs connected to column switches 142, and a set of outputs connected to data pads 160. Write data path 154 has a set of inputs connected to data pads 160, and a set of outputs connected to column switches 142.

Control logic circuit 170 has inputs for receiving a variety of input signals, and outputs for providing a set of control signals labeled "CONTROL" to the various blocks of memory 100 to control their operation in response to received commands. In particular, memory 100 is a double data rate (DDR) DRAM such as a DDR23 or DDR4 DRAM and control logic circuit 170 receives a pair of clock signals labeled "CK" and "$\overline{CK}$" and operates synchronously with respect to those signals. Control logic circuit 170 also receives a set of DRAM command signals including signals labeled "$\overline{CS}$", "$\overline{RAS}$", "$\overline{CAS}$", and "$\overline{WE}$", a set of other command signals, and a set of bank address signals labeled "BA[2:0]". Control logic circuit 170 includes a command decoder 172 for responding to the command signals as will be described below.

In operation, memory 100 allows concurrent operations in the memory banks and in one embodiment, memory 100 is compatible with one of the double data rate (DDR) standards published by the Joint Electron Device Engineering Council (JEDEC), such as DDR3 or DDR4. In order to access data, a memory accessing agent such as a data processor activates a row in a memory bank by issuing an activate ("ACT") command. In response to the ACT command, data from memory cells along the selected row such as row 125 in BANK 0 are stored in the corresponding page buffer such as page buffer 124. In DRAMs, data reads are destructive to the contents of the memory cells, but a copy of the data is stored in page buffer 124. After the memory accessing agent finishes accessing data in row 125, it closes the row by issuing a precharge ("PRE") command. The PRE command causes the data in page buffer 124 to be restored to the dynamic memory cells along row 125.

Since memory 100 is a DRAM, the charge in the memory cells slowly leaks, and thus the data must be periodically refreshed. The refresh interval (known as $t_{REFI}$) is based on the amount of time in which weak memory cells will lose their contents due to leakage. For example in DDR4 DRAMs, $t_{REFI}$ is equal to 7.8 microseconds (μs) in typical environments.

In DRAMs formed with modern, deep sub-micron manufacturing processes, repeated activations of a given row can upset the data stored in memory cells in physically adjacent rows. For example, every time row 125 is activated and precharged, the charge in memory cells in adjacent rows 126 and 127 is changed. If row 125 is activated and precharged too many times before memory cells in rows 126 and 127 are refreshed, then their data may become corrupted.

In order to mitigate the data corruption problem without redesigning the memory, the inventor has developed a new type of command known as an adjacent command. One form of the adjacent command is known as the activate adjacent (ACTADJ) command. The ACTADJ command uses an available command encoding. One example of an available command encoding is a reserved command encoding of the command input signals. Another example of an available command encoding is an unused address bit for memories with smaller than the largest defined density. For example, DDR3 specifies address bits A[15:0], but 2 Gb DRAMs use only A[14:0], leaving A[15] available for the ACTADJ command encoding. In response to the ACTADJ command, command decoder 172 causes control logic 170 to generate a sequence of CONTROL signals that control the operation of memory 100 in a different sequence than for a normal ACT command. The row (input on A[13:0]) and bank (input on BA[2:0]) addresses received with the ACTADJ command are used to indicate a particular row in a particular bank, respectively, such as row 125 in bank 120.

In response to the ACTADJ command, control logic circuit 170 causes row address latch and decoder 112 to refresh first and second addresses adjacent to the row address, and then to activate the row address. An example implementation of refresh would be to activate and subsequently precharge a row. For example, if the ACTADJ command is input along with BA[2:0]=[000] and A[13:0] corresponding to row 125 in Bank 0, control logic circuit 170 first activates and subsequently precharges row 126, and then activates and subsequently precharges row 127. Finally control logic circuit 170 activates row 125, which "opens" it and allows subsequent read and write operations. Memory 100 mitigates the row upset problem by immediately refreshing the charge on the memory cells adjacent to the subject row before accessing the subject row.

The ACTADJ command requires the memory accessing agent to keep track of the number of accesses to particular rows in a certain period of time. It also makes a determination of the need to refresh the charge in the memory cells along adjacent rows if it encounters a large number of accesses to the given row in a certain period of time. For example, a memory controller associated with the memory accessing agent can make these determinations by keeping a history of accesses to particular rows (or row groups). In this way, the logic for counting accesses need only to be implemented once in the controller, rather than repeatedly on each memory chip, keeping overall system cost down. In addition, unlike the targeted row refresh technique, memory 100 need not be in the idle state to change the mode to the TRR mode and thus the ACTADJ command requires significantly less overhead than a targeted row refresh according to the TRR mode.

Another form of the adjacent command is known as the precharge adjacent (PREADJ) command. The PREADJ command also uses an available command encoding. During a precharge command, the memory controller does not pass the row address to the memory. DDR3 and DDR4 DRAMs use address bit A10 to distinguish between a PRE command (precharge of a specified bank) and a PREA command (precharge of all banks), leaving all other address bits available to select between the normal and adjacent forms of the precharge command. However one convenient address signal that could be used to encode the PREADJ command is A12/BC#, because the command decoder of memory 100 already uses that signal to decode other commands. In response to the PREADJ command, command decoder 172 causes control logic 170 to generate a sequence of CONTROL signals that control the operation of memory 100 in a different sequence than for a normal PRE command. The bank (input on BA[2:0]) address received with the PREADJ command is used to indicate a particular bank, while memory 100 keeps track of the address of the row whose contents are stored in the page buffer, such as row 125 in bank 120.

In response to the PREADJ command, control logic circuit 170 causes the row address associated with page buffer 124 and decoder 112 to restore the contents of page buffer 124 to the corresponding row in memory bank 120, and then to refresh first and second addresses adjacent to the row address. An example implementation of refresh would be to activate and subsequently precharge a row. For example, if the PREADJ command is input along with BA[2:0]=[000], control logic circuit 170 first precharges row 125, then activates and subsequently precharges row 126, and then activates and subsequently precharges row 127. At this point, bank 120 is in the idle state. Memory 100 mitigates the row upset problem by precharging the active row and thereafter refreshing the charge on the memory cells adjacent to the previously active row.

The PREADJ command, like the ACTADJ command, requires the memory accessing agent to keep track of the number of accesses to particular rows in a certain period of time. The memory controller associated with the memory accessing agent can use the same logic as described for the ACTADJ command above, and the PREADJ command also requires significantly less overhead than a targeted row refresh according to the TRR mode.

Figure 2:
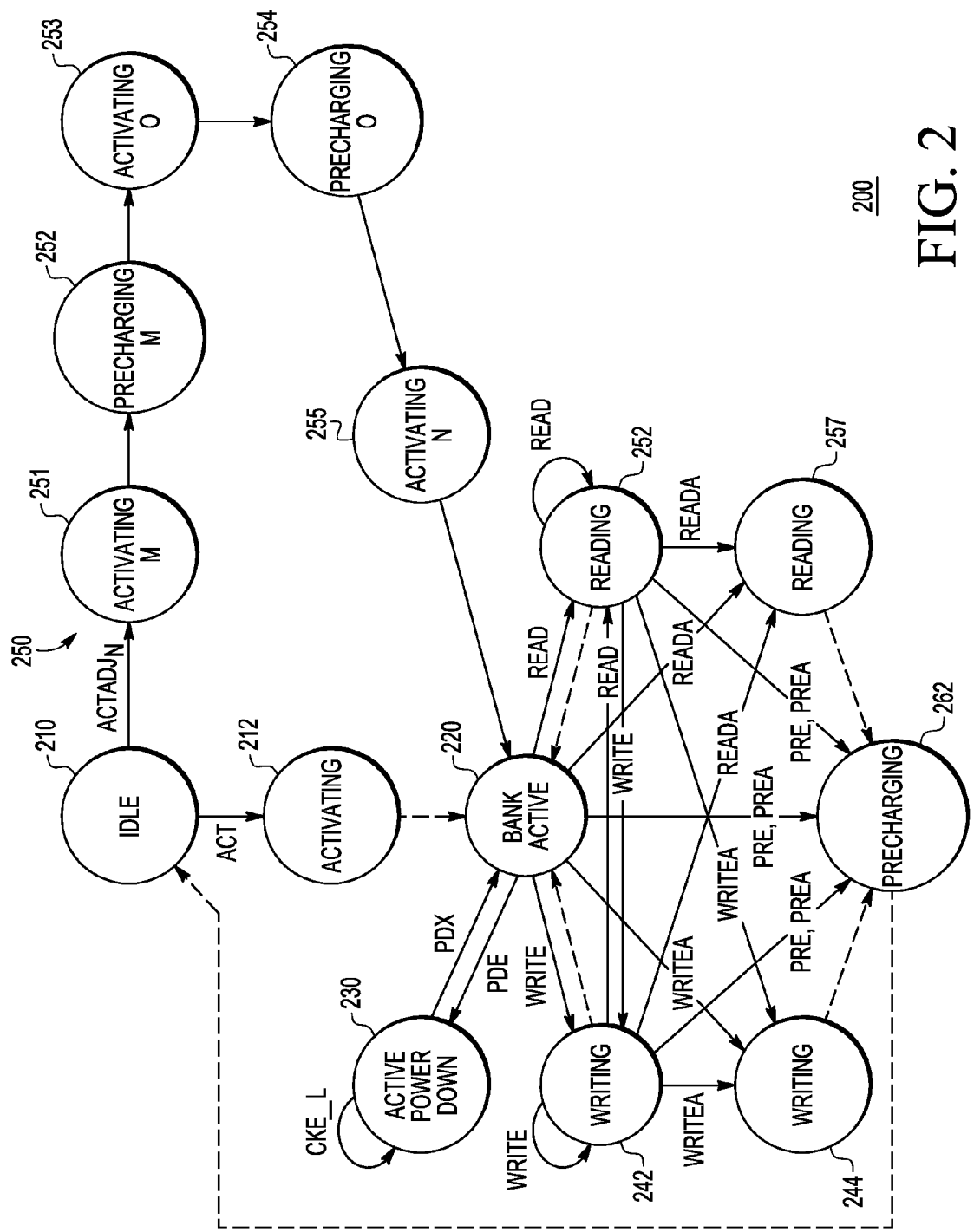
FIG. 2 illustrates a state diagram of the memory of FIG. 1 according to some embodiments.

FIG. 2 illustrates a state diagram 200 of the memory of FIG. 1 according to some embodiments. State diagram 200 includes a portion of the simplified state diagram of DDR3 and DDR4 SDRAMs that includes generally an Idle state 210, a Bank Active state 220, and an Active Power Down state 230, as well as transitory states between some of them including an Activating state 212 between Idle state 210 and Bank Active State 220; a first Writing state 232 associated with a normal Write command and a second Writing state 234 associated with a write with auto precharge (WriteA) command; and a first Reading state 232 associated with a normal read command and a second Reading state 234 associated with a read with auto precharge (ReadA) command; and a Precharging state 262. The operation of these states is well known and described in the DDR3 and DDR4 standards.

In addition, state diagram 200 includes a different set of transitory states 250 that are entered into in response to an ACTADJ command. In state diagram 200, the row address of an ACTADJ command is designated N, a first physically adjacent row is designated M, and a second physically adjacent row is designated O. Set of transitory states 250 includes an Activating M state 251, a Precharging M state 252, an Activating O state 253, a Precharging O state 254, and an Activating N state 255. Memory 100 sequences through states 251-255 in response to an ACTADJ$_N$, in which the designated row address is N, ending in Bank Active state 220. Note that in addition to being physically adjacent to Row N, Rows M and O can have the next lower and next higher addresses, or can have different addresses if the rows are interleaved in memory 100.

Figure 3:
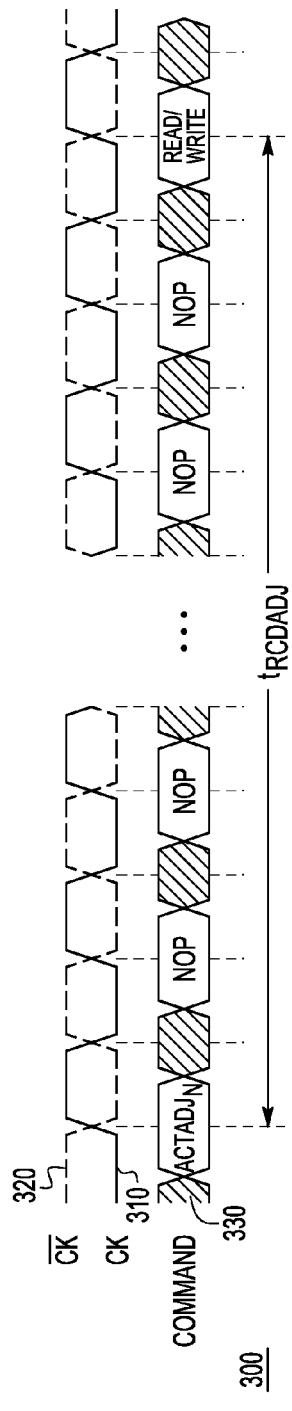
FIG. 3 illustrates a timing diagram showing a first timing parameter used for the operation of the memory of FIG. 1.

FIG. 3 illustrates a timing diagram 300 showing a first timing parameter referred to as "$t_{RCDADJ}$" used for the operation of memory 100 of FIG. 1. In FIG. 3, the horizontal axis represents time in nanoseconds, and the vertical axis the voltage of various signals in volts. FIG. 3 illustrates two sets of signals of interest including clock signal CK shown as waveform 310 and clock signal $\overline{CK}$ shown as waveform 320, and a set of command signals 330. As described above, each command is encoded using several command signals in which the command is indicated by combinations of states of those command signals. After $t_{RCDADJ}$ time from the ACTADJ$_N$ command, the DRAM controller may issue a read or write command to that bank and row.

Figure 4:
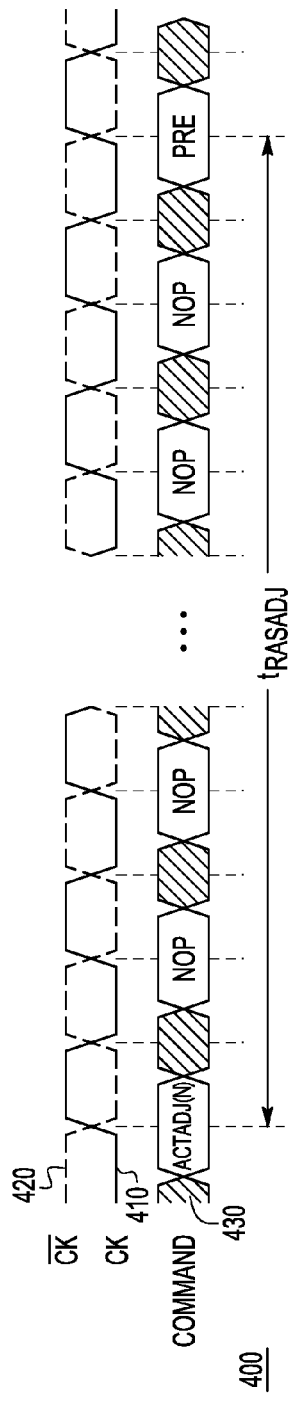
FIG. 4 illustrates a timing diagram showing a second timing parameter used for the operation of the memory of FIG. 1.

FIG. 4 illustrates a timing diagram 400 showing a second timing parameter referred to as "$t_{RASADJ}$" used for the operation of the memory of FIG. 1. In FIG. 4, the horizontal axis represents time in nanoseconds, and the vertical axis the voltage of various signals in volts. FIG. 4 illustrates two sets of signals of interest including clock signal CK shown as waveform 410 and clock signal $\overline{CK}$ shown as waveform 420, and a set of command signals 430. As described above, each command is encoded using several command signals in which the command is indicated by combinations of states of those command signals. After $t_{RASADJ}$ time from the ACTADJ$_N$ command, the DRAM controller may issue a precharge command to that bank.

Figure 5:
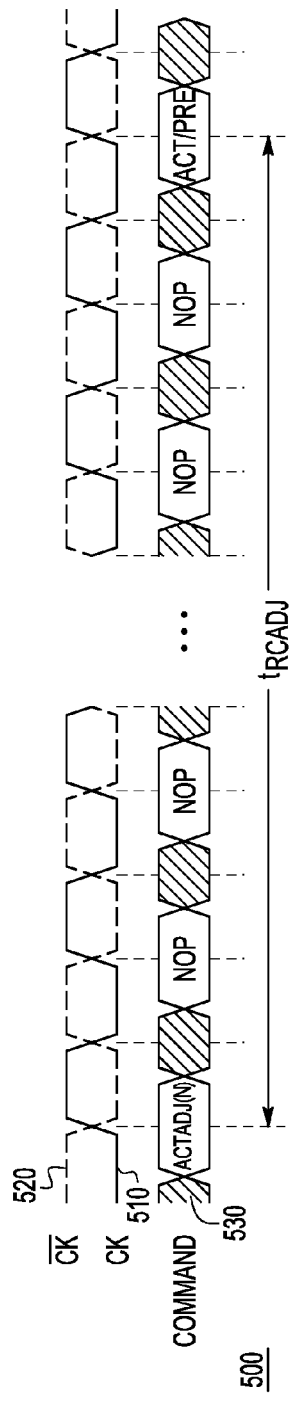
FIG. 5 illustrates a timing diagram showing a third timing parameter used for the operation of the memory of FIG. 1.

FIG. 5 illustrates a timing diagram showing a third timing parameter referred to as "$t_{RCADJ}$" used for the operation of the memory of FIG. 1. In FIG. 5, the horizontal axis represents time in nanoseconds, and the vertical axis the voltage of various signals in volts. FIG. 5 illustrates two sets of signals of interest including clock signal CK shown as waveform 510 and clock signal $\overline{CK}$ shown as waveform 520, and a set of command signals 530. As described above, each command is encoded using several command signals in which the command is indicated by combinations of states of those command signals. After $t_{RCADJ}$ time from the ACTADJ$_N$ command, the DRAM controller may issue an activate (ACT) or refresh (REF) command to that bank.

All three parameters described above, $t_{RCDADJ}$, $t_{RASADJ}$, and $t_{RCADJ}$, reflect the additional amount of time required to activate and precharge adjacent rows as well as activating the given row N. Yet even with these additional amounts of time, the use of the ACTADJ command requires significantly less overhead than the TRR approach.

Figure 6:
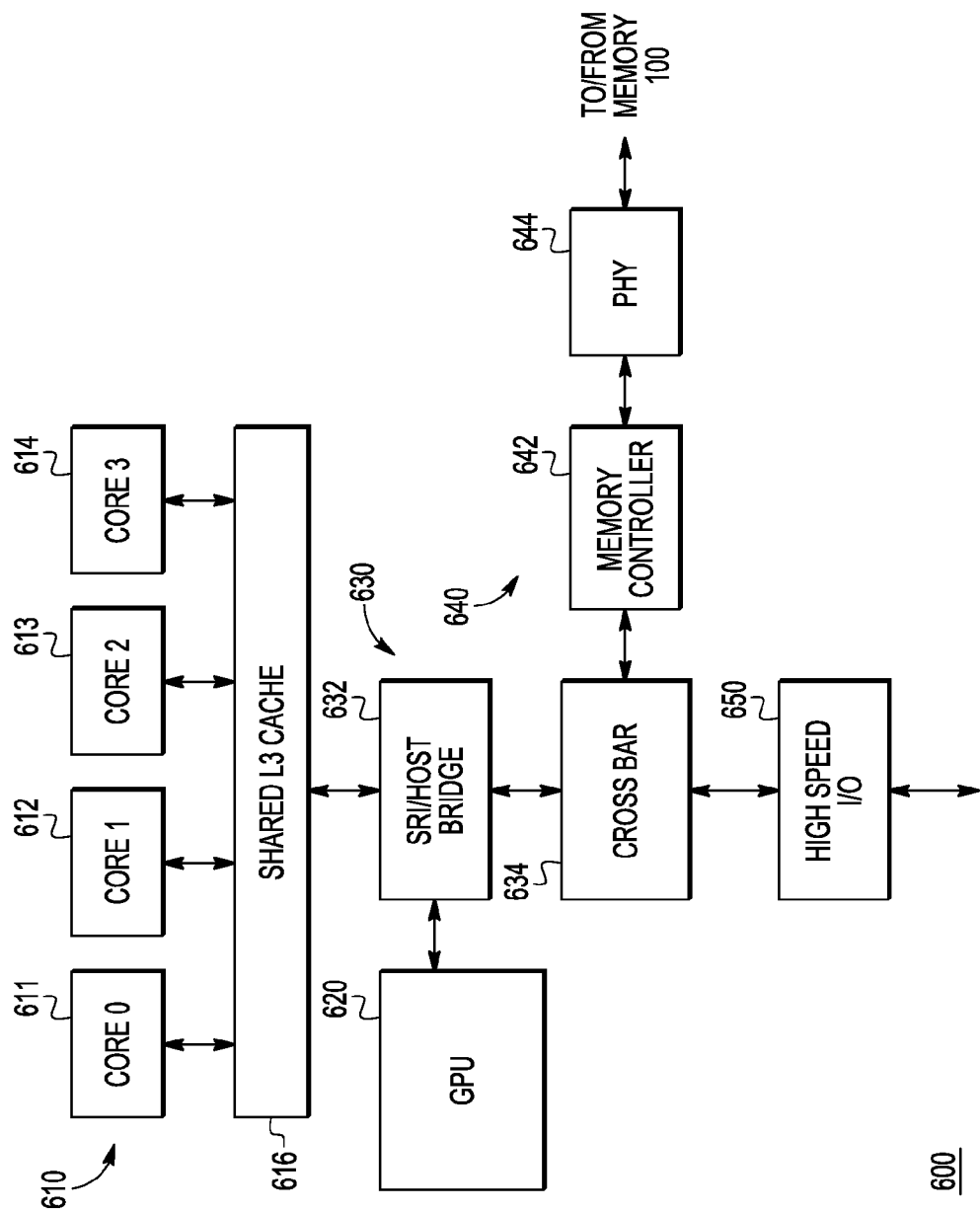
FIG. 6 illustrates in block diagram form a data processor with a memory controller according to some embodiments.

FIG. 6 illustrates in block diagram form a data processor 600 with a memory controller 642 according to some embodiments. Data processor 600 generally includes a CPU portion 610, a GPU core 620, an interconnection circuit 630, a memory access controller 640, and an input/output controller 650.

CPU portion 610 includes CPU cores 611-614 labeled "CORE0", "CORE1", "CORE2", and "CORE3", respectively, and a shared level three (L3) cache 616. Each CPU core is capable of executing instructions from an instruction set and may execute a unique program thread. Each CPU core includes its own level one (L1) and level two (L2) caches, but shared L3 cache 616 is common to and shared by all CPU cores. Shared L3 cache 616 operates as a memory accessing agent to provide memory access requests including memory read bursts for cache line fills and memory write bursts for cache line writebacks.

GPU core 620 is an on-chip graphics processor and also operates as a memory accessing agent.

Interconnection circuit 630 generally includes system request interface (SRI)/host bridge 632 and a crossbar 634. SRI/host bridge 632 queues access requests from shared L3 cache 616 and GPU core 620 and manages outstanding transactions and completions of those transactions. Crossbar 634 is a crosspoint switch between five bidirectional ports, one of which is connected to SRI/host bridge 632.

Memory access controller 640 has a bidirectional port connected to crossbar 634 for connection to off-chip DRAM. Memory access controller 640 generally includes a memory controller 642 and a physical interface circuit 644 labeled "PHY". Memory controller 642 generates specific read and write transactions for requests from CPU cores 611-614 and GPU core 620 and combines transactions to related addresses. Memory controller 642 handles the overhead of DRAM initialization, refresh, opening and closing pages, grouping transactions for efficient use of the memory bus, and the like. Physical interface circuit 644 provides an interface to external DRAMs, such as DIMMs by managing the physical signaling. Together memory controller 642 and physical interface circuit 644 support at least one particular memory type, and may support both DDR3 and DDR4.

Input/output controller 650 includes one or more high speed interface controllers. For example, input/output controller may contain three interface controllers that comply with the HyperTransport link protocol.

Data processor 600 includes both CPU cores and a GPU core, and so is known as an accelerated processing unit (APU). This variety of data accessing agents can generate several access patterns that may cause the data upset problem. For example, one of CPU cores 611-614 may run a program thread that strides through data stored in memory in patterns that cause frequent activations of the same memory row. Another example is when one of CPU cores 611-614 or GPU core 620 repetitively accesses data from the same row and from an uncacheable region. Yet another example is when more than one of CPU cores 611-614 or GPU core 620 accesses and modifies the same data element. In this case, shared L3 cache 616 may follow a policy of updating main memory each time that data modified by one core is accessed by another core. Other scenarios are also possible.

Figure 7:
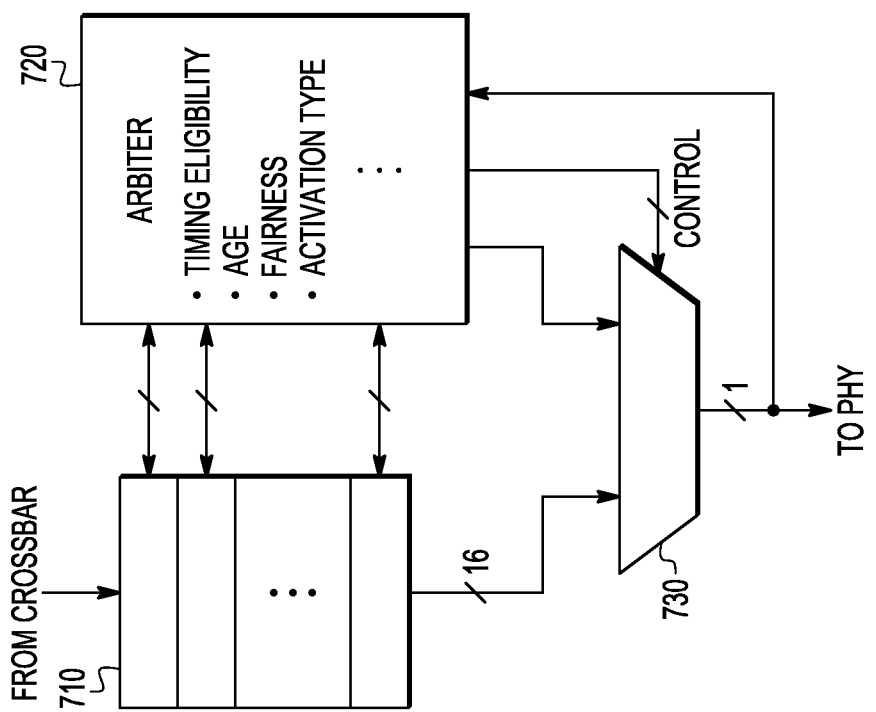
FIG. 7 illustrates in block diagram form the memory controller of FIG. 6 according to some embodiments.

FIG. 7 illustrates in block diagram form memory controller 642 of FIG. 6 according to some embodiments. Memory controller 642 includes a queue 710, an arbiter 720, and a multiplexer 730. Queue 710 stores memory access requests received from crossbar 634. The memory access requests could be read or write cycles to any bank in the memory and are generated by any one of the memory accessing agents in data processor 600. In the example of FIG. 7, queue 610 has a total of 16 entries for all banks and ranks, each entry storing an access address, data in the case of a write cycle, and a tag that indicates its relative age. Arbiter 720 is bidirectionally connected to each entry in queue 410 for reading its attributes, has an additional input for receiving an access as it is dispatched, has an output for providing protocol commands such as ACT and PRE commands, and has a control output for selecting one of the sixteen entries to send to physical interface circuit 644. Multiplexer 730 has sixteen inputs connected to respective entries of queue 710, an additional input connected to the output of arbiter 720, a control input connected to the output of arbiter 720, and an output for providing a dispatched access to physical interface circuit 644.

In operation, queue 710 stores accesses received from crossbar 334 and assigns a tag to indicate its relative age. Arbiter 720 determines which pending access in queue 710 to schedule and dispatch to physical interface circuit 644 based on a set of policies such a timing eligibility, age, and fairness. As such it includes a page table to indicate open pages in each bank and rank of the memory system. In general, arbiter 720 can increase the efficiency of the memory system bus by scheduling multiple accesses to the same row together and delaying an older access to a different row in the same bank. Thus arbiter 720 increases efficiency by selectively deferring accesses to a different row than a currently activated row. Arbiter 720 also uses an entry's age tag to limit the latency of an access. Thus arbiter 720 will interrupt a series of accesses to an open page in memory when an access to another page has been pending for a certain amount of time. Arbiter 720 also schedules accesses to other memory banks in between ACT and PRE commands to a given memory bank to hide the overhead.

Arbiter 720 also takes into account activation type based on whether a particular row has been accessed more than a threshold within a given time window. If arbiter 720 selects a memory access that requires an activation of a row in the memory, then it selects either an activate command or an activate adjacent command based on the number of activate commands sent to the row in a predetermined time window. For example once the number of activations in the window exceeds a threshold, arbiter 720 substitutes an ACTADJ command for an ACT command. In this way, arbiter 720 mitigates the data upset problem, either by eliminating it entirely or reducing it to a sufficiently low likelihood.

Figure 8:
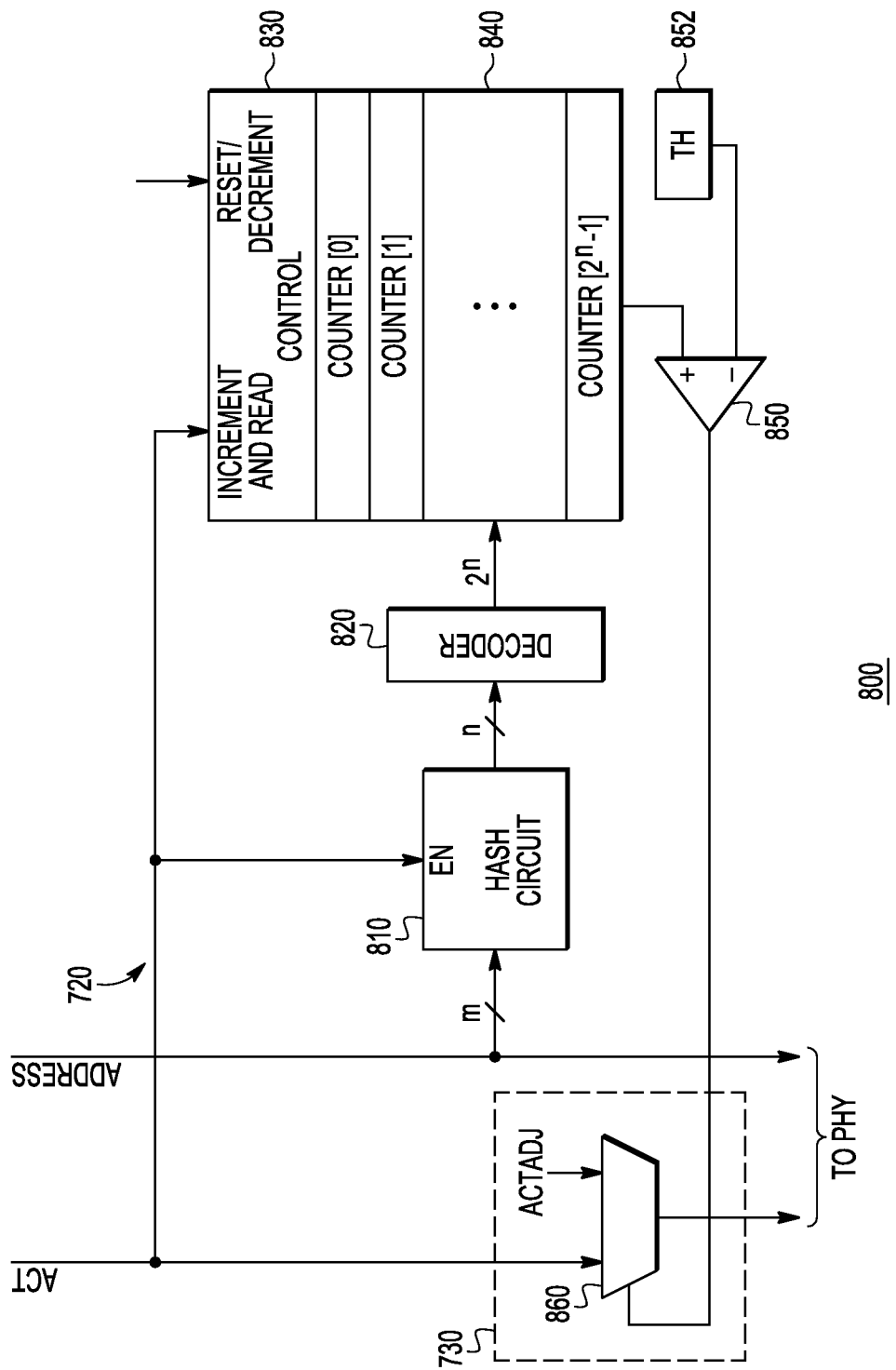
FIG. 8 illustrates in block diagram form a portion of a memory controller such as the memory controller of FIG. 6 according to some embodiments.

FIG. 8 illustrates in block diagram form a portion 800 of a memory controller such as memory controller 642 of FIG. 6 according to some embodiments. Portion 800 shows a portion of arbiter 720 and a portion of multiplexer 730 numbered as such in FIG. 8. Arbiter 720 generally includes a hash circuit 810, a decoder 820, a control circuit 830, a set of counters 840, a comparator 850, and a multiplexer. Hash circuit 810 has an input for receiving m bits of an access address labeled "ADDRESS", a control input for receiving an ACT command, and an output for providing an n-bit hashed address. Decoder 820 has an input connected to the output of hash circuit 810, and an output for providing $2^n$ decoded select signals. Control circuit 830 has a first input labeled "INCREMENT AND READ", a second input labeled "RESET/DECREMENT", and an output. Counters 840 include a set of n counters including representative counters labeled "COUNTER[0]", "COUNTER[1]", and "COUNTER[$2^n-1$]". Each counter is connected to the output of decoder 820 to receive a respective one of the $2^n$ decoded select signals and to the output of control circuit 830, and has an output for providing a respective count value. The count values of counters 840 are connected together such that set of counters 840 provides a count value of a selected counter to an output thereof. Comparator 850 has a first input connected to the output of counters 840, a second input for receiving a threshold signal, and an output. Command multiplexer 860 has a first input for receiving an ACTADJ command, a second input for receiving an ACT command, and an output for providing a command along with the ADDRESS to PHY 644. In some embodiments, multiplexer 860 is part of arbiter 720. In other embodiments, multiplexer 860 is part of multiplexer 730.

In operation, arbiter 720 selects an entry from queue 710 based on factors like timing eligibility and fairness as described above. However for those selected entries that require an activation command, arbiter 720 further determines the type of activation command to be dispatched. In general arbiter 720 provides a control signal to command multiplexer 860 to select either the ACT or ACTADJ command. The selection is performed by first hashing the m-bit input ADDRESS into a smaller number of bits n. Next, the n-bit address is decoded in decoder 820 and is used to select one of $2^n$ counters. Each counter maintains a count of the number of activations of the hashed row in the time window. The outputted count value is compared to a threshold value labeled "TH" stored in a threshold register 832. If the selected count value does not exceed the threshold, then comparator 850 keeps its output in the inactive state to cause multiplexer 860 to select the first input thereof. If the selected count value exceeds the threshold, then comparator 850 activates its output to cause multiplexer 860 to select the second input thereof.

Control circuit 830 is responsive to the ACT command to increment the counter selected by the hashed address and to cause it to output its count value. Control circuit 830 is also responsive to its second input to adjust the counter over time. In one embodiment, arbiter 720 can reset the counters completely over an appropriate time window. In another embodiment, arbiter 720 can make the counters leaky by decrementing them periodically. Moreover arbiter 720 also activates the second input of control circuit 830 to cause it to reset a selected counter after the ACTADJ command has been issued, since the ACTADJ command causes the rows adjacent to the input row to be refreshed.

Hash circuit 810 is optional. In another embodiment, hash circuit 810 may be omitted entirely, however this embodiment would require a larger number of counters to be maintained. Moreover the value of n may be varied to either require less hardware for smaller values of n, or require less overhead for the false hits that may be indicated by the hashed address.

Figure 9:
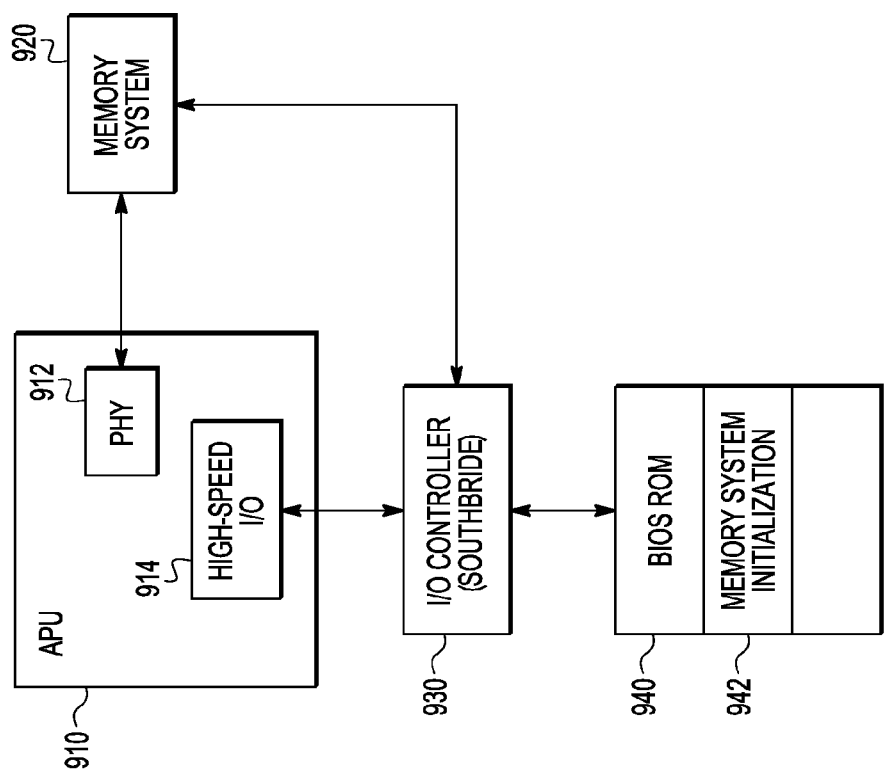
FIG. 9 illustrates in block diagram form a data processing system according to some embodiments.

FIG. 9 illustrates in block diagram form a data processing system 900 according to some embodiments. Data processing system 900 includes a data processor in the form of an accelerated processing unit (APU) 910, a memory system 920, an input/output (I/O) controller known as a "SOUTHBRIDGE" 930, and a basic input output system (BIOS) read only memory (ROM) 940. Data processor 910 has a PHY 912 connected to memory system 920 for carrying out memory access operations. In this example, memory system 720 can include one or more dual inline memory modules (DIMMs) that that include memory chips susceptible to the row upset problem. Data processor 910 is also connected through a high-speed I/O circuit 914 to I/O controller 930, which in turn is connected to both memory system 920 and BIOS ROM 940.

On initialization, data processor 910 initializes data processing system 900 by reading instructions stored in BIOS ROM 940 through I/O controller 930. BIOS ROM 740 includes a memory system initialization portion 742. Memory system initialization portion 742 causes data processor 910 to read certain row upset parameters in a serial presence detect (SPD) ROM in memory system 920, and calculate appropriate time windows for determining whether to issue ACT or ACTADJ commands.

Note that ACTADJ is an example of a class of commands known as adjacent commands that perform a certain operation on an input row address (i.e. the memory locations corresponding to the input row address) but also activate and subsequently precharge addresses adjacent to the input row address. Another example is the PREADJ command, which will now be described. The differences between the ACTADJ command and the PREADJ command is the desired operation and order of the steps. ACTADJ is useful when the memory controller desires to activate a particular row when it recognizes that the particular row has been accessed too many times in a given window. The activate of the particular row takes place after the adjacent rows are refreshed. On the other hand, PREADJ is useful when the memory controller recognizes that the particular row has been accessed too many times in a given window while the particular row is active and the memory controller desires to precharge the particular row. The precharge takes place before the adjacent rows are refreshed. Also the PREADJ command avoids the additional latency penalty of a subsequent read or write command caused by the $t_{RCDADJ}$ parameter.

Figure 10:
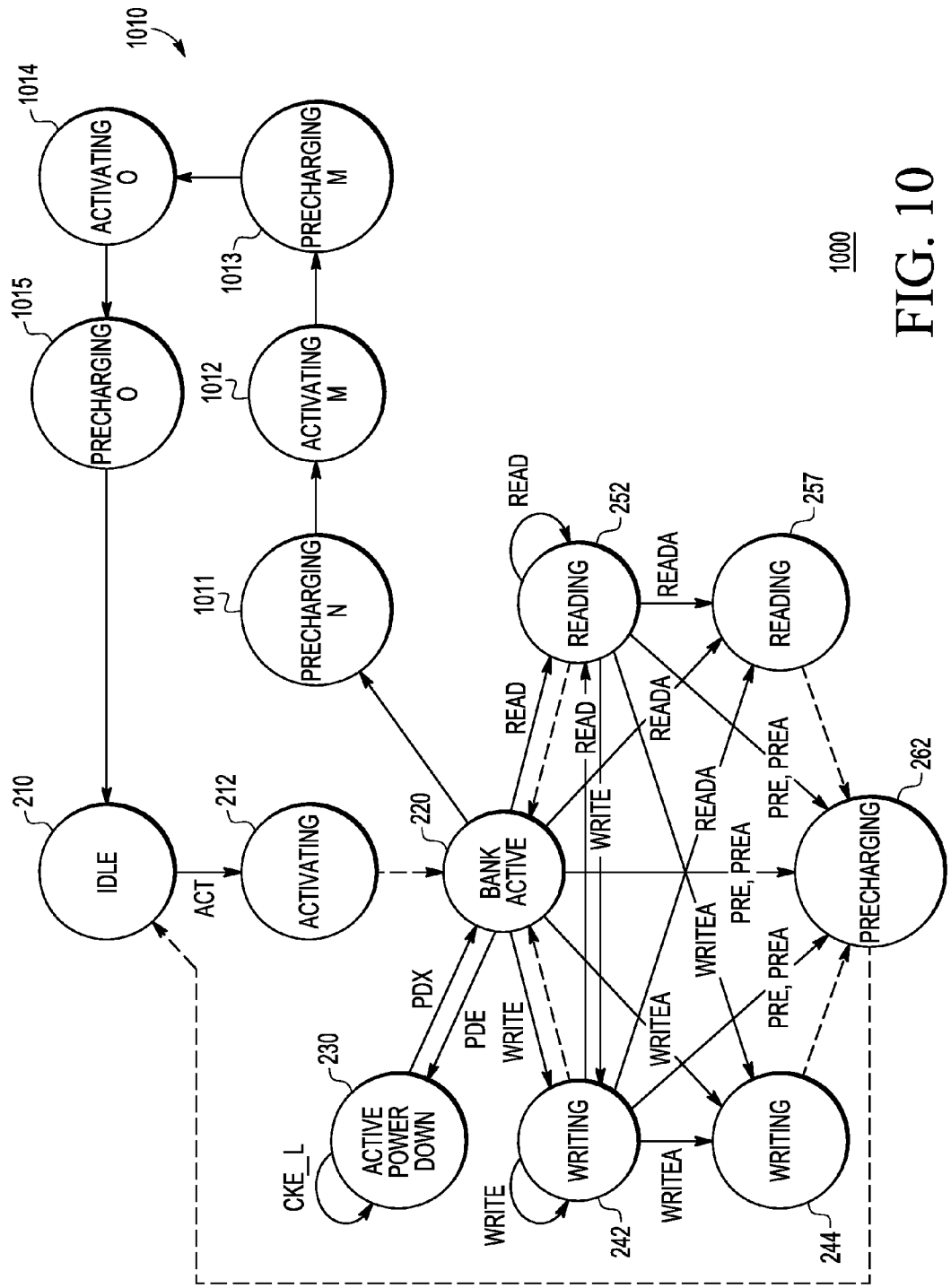
FIG. 10 illustrates another state diagram of the memory of FIG. 1 according to some embodiments.

FIG. 10 illustrates another state diagram 1000 of the memory of FIG. 1 according to some embodiments. State diagram 1000 includes a portion of the simplified state diagram of DDR3 and DDR4 SDRAMs that includes generally an Idle state 210, a Bank Active state 220, and an Active Power Down state 230, as well as transitory states between some of them including an Activating state 212 between Idle state 210 and Bank Active State 220; a first Writing state 232 associated with a normal Write command and a second Writing state 234 associated with a write with auto precharge (WriteA) command; and a first Reading state 232 associated with a normal read command and a second Reading state 234 associated with a read with auto precharge (ReadA) command; and a Precharging state 262. The operation of these states is well known and described in the DDR3 and DDR4 standards.

In addition, state diagram 1000 includes a set of transitory states 1010 that are entered into in response to the PREADJ command. In state diagram 1000, the row address of a PREADJ command is designated N, a first physically adjacent row is designated M, and a second physically adjacent row is designated O. Set of transitory states 1010 includes a Precharging N state 1011, an Activating M state 1012, a Precharging M state 1013, an Activating O state 1014, and a Precharging O state 1015. Memory 100 sequences through states 1011-1015 in response to a PREADJ$_N$ command, in which the designated row address is N, ending in Idle state 210. Note that in addition to being physically adjacent to Row N, Rows M and O can have the next lower and next higher addresses, or can have different addresses if the rows are interleaved in memory 100.

After the PREADJ command is completed, the bank is in the Idle state and can receive new commands after a new time period known as "$t_{RPADJ}$. The $t_{RPADJ}$ Period Reflects the time to precharge the current row in the DRAM page buffer and the additional amount of time required to activate and precharge adjacent rows. Memory controller 642 would operate similarly to that described above because ACT and PRE are paired commands.

It should be apparent that a memory may implement either or both of the ACTADJ and PREADJ commands. If implementing both commands, it would implement both transitory states 250 for the ACTADJ command and transitory states 1010 for the PREADJ comment. Moreover memory 100 may also implement additional adjacent commands in a manner similar to those set forth for the ACTADJ and PREADJ commands. Also the order of refreshing the adjacent rows, such as lower address followed by higher address, is not important and they can be refreshed in either order. In some modern DRAMs it may be possible to perform some of the steps of the ACTADJ and PREADJ commands in parallel. Moreover in some embodiments more than two adjacent rows can be refreshed in response to an adjacent command.

Although data processor 600 includes a memory controller 642 that determines eligibility using hardware circuits such as an address register, counter, and comparison logic, these functions may be implemented with various combinations of hardware and software. Some of the software components may be stored in a computer readable storage medium for execution by at least one processor. Moreover some or all of the method illustrated described above may also be governed by instructions that are stored in a computer readable storage medium and that are executed by at least one processor. Each of the operations described above may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Moreover, memory 100 of FIG. 1 or data processor 300 of FIG. 3 or any portion thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. The illustrated data processor includes four CPU cores and one GPU core but in other embodiments, the data processor may include a different number of memory accessing agents. Moreover the illustrated data processor includes one memory controller and an associated memory channel, but in other embodiments the data processor may include multiple memory controllers with corresponding memory channels. As noted above, an optional hash circuit can be included in some embodiments to reduce circuit area and excluded in other embodiments to avoid false positives and thus maintain higher performance. In other embodiments, the memory controller can maintain a separate queue for each memory bank. In these embodiments, the number of counters would increase proportionally.

Accordingly, it is intended by the appended claims to cover all modifications of the disclosed embodiments that fall within the scope of the disclosed embodiments.

What is claimed is:

1. A system comprising:
   a memory system; and
   a data processor having an output for coupling to said memory system, for providing selected ones of a normal command and an adjacent command based on a number of activate commands sent to a row in said memory system during a predetermined time window, wherein said data processor determines timing eligibility of a subsequent normal command based on a parameter specifying a time from said adjacent command to said subsequent normal command,
   wherein said memory system is responsive to said adjacent command and a row address to perform an operation on said row address, and to refresh first and second row addresses adjacent to said row address.

2. The system of claim 1, wherein said data processor comprises at least one central processing unit core and at least one graphics processing unit core.

3. The system of claim 1, wherein said data processor comprises:
   a memory access generating circuit;
   a memory controller coupled to said memory access generating circuit for generating said selected ones of said normal command and said adjacent command based on said number of activate commands sent to said row in said memory system during said predetermined time window; and
   a physical interface circuit coupled said memory controller to said memory system for providing a physical interface therebetween.

4. The system of claim 3 further comprising:
   an input/output controller coupled to said memory access generating circuit and said memory system; and
   a non-volatile memory coupled to said input/output controller and including a memory system initialization portion storing instructions which, when executed by said data processor, causes said data processor to access said memory system to determine capabilities thereof through said input/output controller, and to configure said memory controller to selectively provide said adjacent command based on said capabilities.

5. The system of claim 1, wherein the memory system comprises at least one memory comprising:
   a memory bank having a plurality of rows and a plurality of columns with volatile memory cells at intersections of said plurality of row and said plurality of columns;
   a page buffer coupled to said plurality of columns for storing contents of a selected one of said plurality of rows; and
   an access circuit responsive to said adjacent command and said row address to perform said operation on said row address, and to refresh first and second row addresses adjacent to said row address.

6. The system of claim 5, wherein said adjacent command comprises an activate adjacent command and said operation comprises an activate operation.

7. The system of claim 5, wherein said adjacent command comprises a precharge adjacent command and said operation comprises a precharge operation.

8. The system of claim 5, wherein said access circuit comprises:
   a row decoder having an input for receiving said row address, and an output coupled to said memory bank;
   a column decoder having an input for receiving a column address, and an output; and
   a plurality of column switches coupled to said page buffer and to said output of said column decoder and having an output for selecting a portion of said page buffer in response to said output of said column decoder.

9. The system of claim 8, wherein said access circuit further comprises:
   a data path coupled to said plurality of column switches and a plurality of bonding pads for providing data from said plurality of column switches in response to a read command, and providing data from said plurality of bonding pads to said plurality of column switches in response to a write command.

10. The system of claim 8, wherein said access circuit further comprises:
    control logic having an input for receiving a plurality of command signals, and an output coupled to said page buffer and said row decoder for causing said row decoder and said page buffer to perform said operation and to activate and subsequently precharge first and second row addresses adjacent to said row address.

11. The system of claim 1, wherein said data processor comprises a memory controller, said memory controller comprising:
    a queue having a plurality of entries for storing memory accesses received from a memory accessing agent; and an arbiter coupled to said queue for providing a plurality of control signals to select a memory access from said queue for dispatch to said memory system, and if said memory access requires said operation to said row in said memory system, further to select either said normal command corresponding to said operation or said adjacent command corresponding to said operation based on a number of activate commands sent to said row in said predetermined time window.

12. The system of claim 11, wherein said normal command comprises an activate command and said adjacent command comprises an activate adjacent command.

13. The system of claim 12, wherein said arbiter determines timing eligibility of said memory access based on a parameter specifying a time from said activate adjacent command to one of a subsequent read or write command.

14. The system of claim 11, wherein said normal command comprises a precharge command and said adjacent command comprises a precharge adjacent command.

15. The system of claim 14, wherein said arbiter determines timing eligibility of said memory access based on a parameter specifying a time from said precharge adjacent command to one of a subsequent read or write command.

16. The system of claim 11, further comprising:
a multiplexer having an input coupled to said plurality entries of said queue, a control input coupled to said arbiter for receiving said control signal, and an output for providing a selected access including a selected one of said normal command and said adjacent command.

17. The system of claim 11, wherein said arbiter comprises:
a decoder having an input for receiving an input row address, and an output for providing a plurality of select signals;
a plurality of counters each having an input coupled to a corresponding one of said plurality of select signals, and an output for providing a count value when selected; and
a comparator having a first input coupled to said output of each of said plurality of counters, a second input for receiving a threshold, and an output for providing one of said plurality of control signals to select either said normal command or said adjacent command.

18. The system of claim 17, wherein said arbiter further comprises:
a hash circuit having an input for receiving said row address, and an output for providing said input row address, wherein said hash circuit maps a first number of row addresses to a second, smaller number of input row addresses.

19. The system of claim 18, wherein said arbiter further comprises:
a control circuit coupled to said plurality of counters and responsive to an input activate command to increment a corresponding one of said plurality of counters.

20. The system of claim 19, wherein said control circuit further has a reset input for resetting each of said plurality of counters in response to a first periodic signal, and a decrement input for decrementing each of said plurality of counters in response to a second periodic signal.

21. A method comprising:
selecting one of a normal command and an adjacent command for sending to a memory system, said selecting based on a number of activate commands sent to a row in said memory system during a predetermined time window;
sending said selected one of said normal command and said adjacent command to said memory system;
responding to said adjacent command and a row address in said memory system by:
performing an operation on said row address in said memory system; and
refreshing first and second row addresses adjacent to said row address, and
determining timing eligibility of a subsequent normal command based on a parameter specifying a time from said adjacent command to said subsequent normal command.

22. The method of claim 21 wherein:
said selecting one of said normal command and said adjacent command comprises selecting one of a read command and a write comment.

23. The method of claim 21 wherein:
said selecting one of said normal command and said adjacent command comprises selecting one of said normal command and one of an activate adjacent command and a precharge adjacent command.

24. The method of claim 21 further comprising:
generating memory accesses using both a central processing unit core and a graphics processing unit core; and
performing said selecting in response to said memory accesses.

25. The method of claim 21 further comprising:
accessing said memory system to determine capabilities thereof; and
configuring a memory controller to selectively provide said adjacent command based on said capabilities.

26. The method of claim 21 wherein said normal command comprises an activate command and said adjacent command comprises an activate adjacent command, and the method further comprises:
determining timing eligibility of a subsequent read or write command based on a parameter specifying a time from said activate adjacent command to one of said subsequent read or write command.

27. The method of claim 21 wherein said normal command comprises a precharge command and said adjacent command comprises a precharge adjacent command, and the method further comprises:
determining timing eligibility of a subsequent read or write command based on a parameter specifying a time from said precharge adjacent command to one of said subsequent read or write command.

* * * * *